United States Patent
Bae et al.

(10) Patent No.: US 9,041,028 B2
(45) Date of Patent: May 26, 2015

(54) LIGHT EMITTING DEVICE, METHOD FOR FABRICATING THE LIGHT EMITTING DEVICE, AND LIGHT EMITTING DEVICE PACKAGE

(75) Inventors: Jung Hyeok Bae, Seoul (KR); Byung Hak Jeong, Seoul (KR); Kyung Wook Park, Seoul (KR); Chung Song Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 65 days.

(21) Appl. No.: 13/033,157

(22) Filed: Feb. 23, 2011

(65) Prior Publication Data
US 2011/0248301 A1    Oct. 13, 2011

(30) Foreign Application Priority Data
Apr. 9, 2010    (KR) .......................... 10-2010-0032910

(51) Int. Cl.
| | |
|---|---|
| H01L 33/44 | (2010.01) |
| H01L 33/48 | (2010.01) |
| H01L 33/52 | (2010.01) |
| H01L 33/60 | (2010.01) |
| H01L 33/20 | (2010.01) |
| H01L 33/00 | (2010.01) |
| H01L 33/40 | (2010.01) |
| H01L 33/64 | (2010.01) |

(52) U.S. Cl.
CPC ............. *H01L 33/44* (2013.01); *H01L 33/0079* (2013.01); *H01L 33/20* (2013.01); *H01L 33/405* (2013.01); *H01L 33/647* (2013.01); *H01L 2924/0002* (2013.01); *H01L 2224/48091* (2013.01)

(58) Field of Classification Search
None
See application file for complete search history.

(56) References Cited

U.S. PATENT DOCUMENTS

| | | | |
|---|---|---|---|
| 4,840,922 A * | 6/1989 | Kobayashi et al. | 438/29 |
| 7,208,755 B2 * | 4/2007 | Ishizaki | 257/22 |
| 7,344,904 B2 * | 3/2008 | Kim et al. | 438/31 |
| 2006/0186418 A1 | 8/2006 | Edmond et al. | 257/79 |

(Continued)

FOREIGN PATENT DOCUMENTS

| | | |
|---|---|---|
| CN | 1945866 A | 4/2007 |
| JP | 2002-009337 A | 1/2002 |

(Continued)

OTHER PUBLICATIONS

European Search Report dated Sep. 28, 2011 issued in Application No. 11 15 7950.

(Continued)

*Primary Examiner* — Johannes P Mondt
(74) *Attorney, Agent, or Firm* — Ked & Associates, LLP

(57) ABSTRACT

Provided are a light emitting device, a method for fabricating the light emitting device, and a light emitting device package. The light emitting device includes a light emitting structure including a first conductive type semiconductor layer, an active layer under the first conductive type semiconductor layer, and a second conductive type semiconductor layer under the active layer, a conductive support member, and a protection member on the light emitting structure. The light emitting structure has a first width and a second width. A difference between the first width and the second width defines a stepped structure or an inclined structure. The protection member is disposed on the stepped or the inclined structure defined by the difference between the first and second widths of the light emitting structure.

13 Claims, 10 Drawing Sheets

(56) References Cited

U.S. PATENT DOCUMENTS

| | | | |
|---|---|---|---|
| 2007/0077673 A1* | 4/2007 | Hwang et al. | 438/46 |
| 2008/0116472 A1 | 5/2008 | Tsunoda | |
| 2008/0121923 A1 | 5/2008 | Harle et al. | 257/100 |
| 2008/0290353 A1* | 11/2008 | Medendorp et al. | 257/89 |
| 2009/0020772 A1* | 1/2009 | Chiu et al. | 257/98 |
| 2009/0275159 A1* | 11/2009 | Tanisaka | 438/33 |
| 2010/0133565 A1* | 6/2010 | Cho et al. | 257/98 |

FOREIGN PATENT DOCUMENTS

| | | |
|---|---|---|
| JP | 2005-045054 A | 2/2005 |
| JP | 2005/109087 A | 4/2005 |
| JP | 2009-525996 T | 7/2009 |
| KR | 10-2007-0080435 A | 8/2007 |
| KR | 10-2009-0057713 A | 6/2009 |
| KR | 10-2009-0073950 A | 7/2009 |
| KR | 10-2009-0118623 A | 11/2009 |
| WO | WO 2005/008740 A2 | 1/2005 |
| WO | WO 2008/045886 A2 | 4/2008 |

OTHER PUBLICATIONS

European Search Report issued in Appln No. 14160387.8 dated May 30, 2014.

Chinese Office Action issued in Application No. 201110062218.6 dated Oct. 27, 2014. (Original Office Action and English Translation).

* cited by examiner

LIGHT EMITTING DEVICE, METHOD FOR FABRICATING THE LIGHT EMITTING DEVICE, AND LIGHT EMITTING DEVICE PACKAGE

CROSS-REFERENCE TO RELATED APPLICATIONS

The present application claims priority under 35 U.S.C. 119 and 35 U.S.C. 365 to Korean Patent Application No. 10-2010-0032910 (filed on Apr. 9, 2010), which is hereby incorporated by reference in its entirety.

BACKGROUND

Embodiments relate to a light emitting device, a method for fabricating the light emitting device, and a light emitting device package.

Light emitting diodes (LEDs) are semiconductor light emitting devices that convert current into light. As luminance of LEDs is increased recently, the LEDs are being used as light sources for displays, vehicles, and illuminations. Also, LEDs emitting highly efficient white light may be realized by using a fluorescent substance or combining LEDs having various colors.

Since an LED has a structure in which thin films, each having a thickness of several nanometers nm to several micrometers μm, are stacked, detailed and reliable processes are required. Specifically, a reliable process is required so that a nitride semi conductor region in which light is generated in a LED fabricating process is not damaged.

SUMMARY

Embodiments provide a light emitting device having improved reliability, a method for fabricating the light emitting device, and a light emitting device package.

Embodiments also provide a light emitting device having high fabrication process yield, a method for fabricating the light emitting device, and a light emitting device package.

In one embodiment, a light emitting device includes: a light emitting structure including a first conductive type semiconductor layer, an active layer under the first conductive type semiconductor layer, and a second conductive type semiconductor layer under the active layer; a conductive support member under the second conductive type semiconductor layer; and a protection member covering a portion of the light emitting structure, wherein the light emitting structure has first and second widths, a difference between the first and second widths defines a stepped structure or an inclined structure, and the protection member covers the stepped or inclined structure defined by the difference between the first and second widths of the light emitting structure.

In another embodiment, a method for fabricating a light emitting device package includes: forming a base semiconductor layer on a substrate; forming etch concave portions spaced a distance greater than that of a second width from each other in the base semiconductor layer; forming protection members spaced a distance of a first width from each other along the etch concave portions on the base semiconductor layer; forming a light emitting structure on the base semiconductor layer and the protection members.

The details of one or more embodiments are set forth in the accompanying drawings and the description below. Other features will be apparent from the description and drawings, and from the claims.

DETAILED DESCRIPTION OF THE EMBODIMENTS

Figure 1:
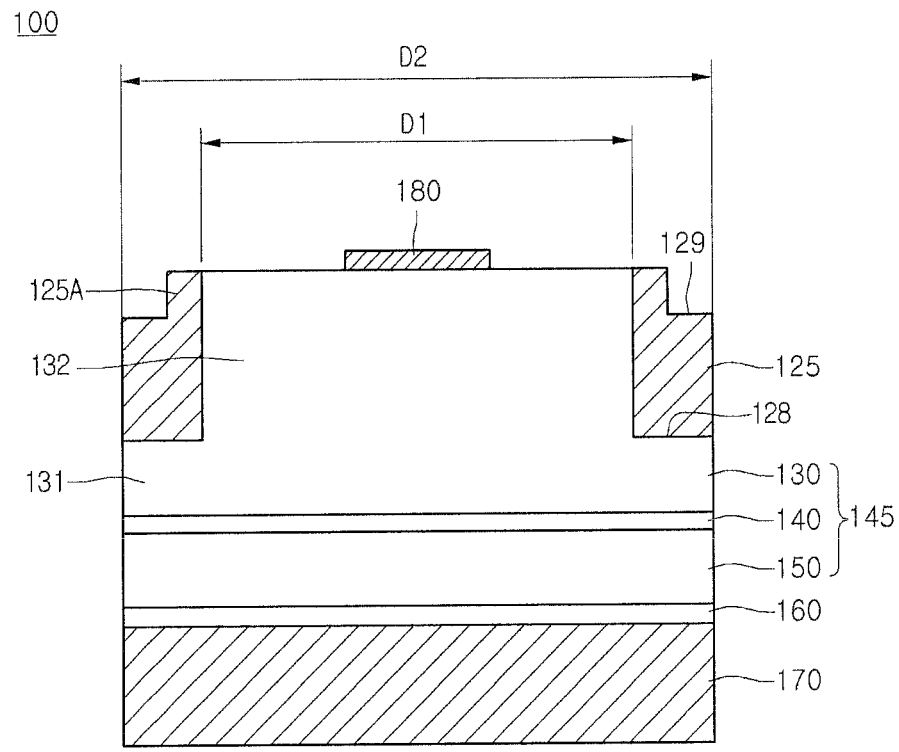
FIG. 1 is a sectional view of a light emitting device according to a first embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device, a method for fabricating the light emitting device, and a light emitting device package according to embodiments will be described with reference to accompanying drawings.

<First Embodiment>

Figure 2:
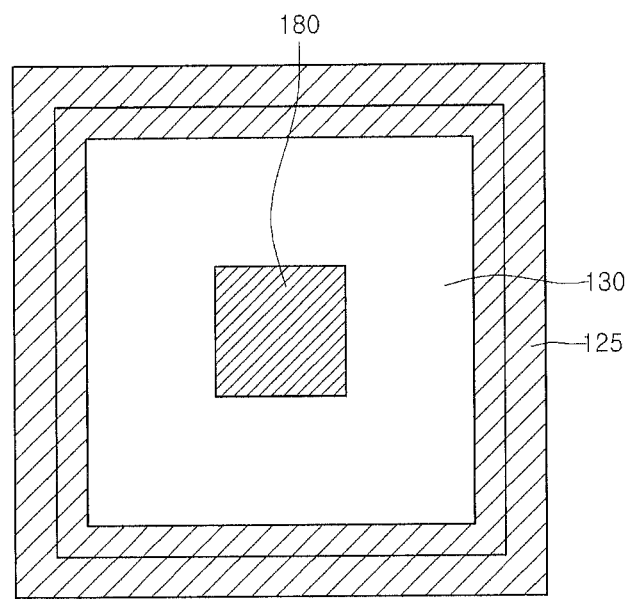
FIG. 2 is a top view of the light emitting device according to the first embodiment.

FIG. 1 is a sectional view of a light emitting device according to a first embodiment, and FIG. 2 is a top view of the light emitting device according to the first embodiment.

Referring to FIGS. 1 and 2, a light emitting device 100 includes a conductive support member 170, a reflective layer 160 on the conductive support member 170, a second conductive type semiconductor layer 150 on the reflective layer 160, an active layer 140 on the second conductive type semiconductor layer 150, a first semiconductor layer 130 on the active layer 140, a protection member 125 on at least one portion of a side surface of an upper end of the first semiconductor layer 130, and a first electrode 180 on the first semiconductor layer 130.

Here, the second conductive type semiconductor layer 150, the active layer 140, and the first semiconductor layer 130 constitute a light emitting structure 145 for generating light.

Also, a stepped structure 128 may be disposed on at least one portion of a side surface of the first semiconductor layer

130. The stepped structure 128 represents a shape when viewed from the outside of the device.

The first semiconductor layer 130 has an upper portion 132 having a first width D1 and a lower portion 131 having a second width D2 greater than the first width D1. The upper portion 132 is further spaced from the active layer 140 than the lower portion 131. The stepped structure 128 disposed on the side surface of the first semiconductor layer 130 may include an inclined structure, but is not limited thereto.

The protection member 125 may be disposed on the stepped structure 128 of the first semiconductor layer 130. The protection member 125 may be formed of a light-transmitting material or an insulator, e.g., at least one of a material having a reflective index less than that of the semiconductor material, $SiO_2$, $Si_xO_y$, $Si_3N_4$, $Si_xN_y$, $SiO_xN_y$, and $Al_2O_3$, but is not limited thereto. A circumference 125A of the protection member 125 may have a stepped structure 129, but is not limited thereto.

The conductive support member 170 may be formed of at least one of Ti, Cr, Ni, Al, Pt, Au, W, Cu, and Mo, or may include a substrate in which impurities are injected. The conductive support member 170 may be used as a base substrate and formed of at least one of Cu, Au, Ni, Mo, Cu—W, and carrier wafers (e.g., Si, Ge, GaAs, ZnO, SiC, SiGe, and GaN).

The conductive support member 170 supports the light emitting structure 145. In addition, the conductive support member 170 together with the first electrode 180 provides a power to the light emitting device 100.

The reflective layer 160 may be formed of a metal or alloy containing at least one of Ag, Al, Pt, and Pd, which have high reflectance.

An ohmic layer or a reflective layer having an ohmic characteristic may be further disposed between the reflective layer 160 and the second conductive type semiconductor layer 150 and may be formed of at least one of indium tin oxide (ITO), indium zinc oxide (IZO), indium zinc tin oxide (IZTO), indium aluminum zinc oxide (IAZO), IZO Nitride (IZON), ATO Nitride (ATON), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO. Also, as necessary, a layer or pattern for blocking a current may be formed between the ohmic layers using current blocking, e.g., a light-transmitting material or insulator.

The reflective layer 160 may reflect light emitted from the light emitting structure 145 to improve light extraction efficiency of the light emitting device 100.

An adhesion layer (not shown) for reinforcing an adhesion of an interface between two layers may be disposed between the conductive support member 170 and the reflective layer 160. Also, the reflective layer 160 may not be provided, but is not limited thereto. The adhesion layer may be formed of a barrier metal or bonding metal, e.g., one of Ti, Au, Sn, Cr, Ga, In, Bi, Cu, Ag, and Ta.

The second conductive type semiconductor layer 150 may be disposed on the conductive support member 170 or the reflective layer 160. For example, the second conductive type semiconductor layer 150 may be realized as a P-type semiconductor layer. The P-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, InN, and AlInN. The P-type semiconductor layer may be doped with a P-type dopant such as Mg, Zn, Ca, Sr, or Ba.

When the reflective layer 160 does not ohmic-contact the second conductive type semiconductor layer 150, an ohmic layer (not shown) for ohmic-contact between two layers may be disposed between the second conductive type semiconductor layer 150 and the reflective layer 160.

The active layer 140 may be disposed on the second conductive type semiconductor layer 150. The active layer 140 is a layer in which electrons (or holes) injected through the first semiconductor layer 130 meets with electrons (holes) injected through the second conductive type semiconductor layer 150 to emit light by a band gap difference of an energy band depending on a formation material of the active layer 140.

For example, the active layer 140 may be formed of a semiconductor material having a compositional formula of $In_xAl_yGa_{1-x-y}N$ ($0 \leq x \leq 1$, $0 \leq y \leq 1$, $0 \leq x+y \leq 1$).

Also, the active layer 140 may have a single quantum well structure or a multi quantum well (MQW) structure.

When the active layer 140 has the quantum well structure, for example, the active layer may have the single or multi quantum well structure in which a well layer having a compositional formula of $In_xAl_yGa_{1-x-y}N$ ($0 \leq x \leq 1$, $0 \leq y \leq 1$, $0 \leq x+y \leq 1$) and a barrier layer having a compositional formula of $In_aAl_bGa_{1-a-b}N$ ($0 \leq a \leq 1$, $0 \leq b \leq 1$, $0 \leq a+b \leq 1$). The well layer may be formed of a material having an energy band gap less than that of the barrier layer.

The active layer 140 may generate light using energy generated by recombination of electrons and holes provided from the first conductive type semiconductor layer 130 and the second conductive type semiconductor layer 150.

The first semiconductor layer 130 may be disposed on the active layer 140.

The first semiconductor layer 130 may include only the first conductive type semiconductor layer or further include a non-conductive semiconductor layer on the first conductive type semiconductor layer, but is not limited thereto.

The non-conductive semiconductor layer may be a layer having significantly low conductivity than those of the first and second conductive type semiconductor layers because it is not doped with a conductive type dopant. For example, the non-conductive semiconductor layer may be an undoped GaN layer.

For example, the first conductive type semiconductor layer may include an N-type semiconductor layer. The N-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, InN, and AlInN. The N-type semiconductor layer may be doped with an N-type dopant such as Si, Ge, or Sn.

The first conductive type semiconductor layer may be realized as an N-type semiconductor, and the second conductive type semiconductor layer may be realized as a P-type semiconductor, and vice versa. Also, a third conductive type semiconductor layer may be disposed between the second conductive type semiconductor layer and the reflective layer. The third conductive type semiconductor layer may be formed of a semiconductor having a polarity opposite to that of the second conductive type semiconductor layer. Thus, the light emitting device 100 may have at least one of an N-P junction structure, a P-N junction structure, an N-P-N junction structure, and a P-N-P junction structure, but is not limited thereto.

The protection member 125 may be disposed on at least one portion of a side surface of an upper region of the first semiconductor layer 130. As shown in FIG. 2, the protection member 125 may surround a side surface of the first semiconductor layer 130.

Also, a stepped structure 128 may be disposed on at least one portion of the side surface of the first semiconductor layer 130. The protection member 125 may be disposed on the stepped structure 128 of the first semiconductor layer 130. The stepped structure 128 may be formed by forming the first conductive layer 130 after the protection member 125 is formed in the fabricating process of the light emitting device 100.

When the stepped structure 128 is formed, the first upper width D1 of the first semiconductor layer 130 may be less than the second lower width D2.

Also, as shown in FIG. 1, a top surface of the first semiconductor layer 130 may flush with a top surface of the protection member 125. A bottom surface of the protection member 125 may be disposed on a circumference of the first semiconductor layer 130. The bottom surface of the protection member 125 may have a width equal to or greater than that of the top surface thereof.

The protection member 125 may be formed of a light-transmitting material or an insulator, e.g., at least one of $SiO_2$, $Si_xO_y$, $Si_3N_4$, $Si_xN_y$, $SiO_xN_y$, and $Al_2O_3$, but is not limited thereto.

The protection member 125 may prevent the light emitting device 100 from being electrically short-circuited with other chips or an external circuit.

Also, the protection member 125 may improve reliability of the fabricating process of the light emitting device 100.

In detail, the protection member 125 may improve reliability of a braking process for separating the plurality of light emitting devices into individual chip units as well as reliability of a laser lift off (LLO) process for separating a substrate from the light emitting structure 145, but is not limited thereto.

The first electrode 180 may be disposed on at least one portion of the top surface of the first semiconductor layer 130. The first electrode 180 together with the conductive support member 170 provides a power to the light emitting device 100. For example, the first electrode 180 may be formed of at least one of Al, Ti, and Cr, but is not limited thereto.

Also, a roughness may be formed on the top surface of the first semiconductor layer 130 to improve the light extraction efficiency of the light emitting device 100.

Hereinafter, a method for fabricating the light emitting device 100 according to the first embodiment will be described in detail with reference to FIGS. 3 to 10. The explanations duplicated with the first embodiment will be omitted.

Figure 3:
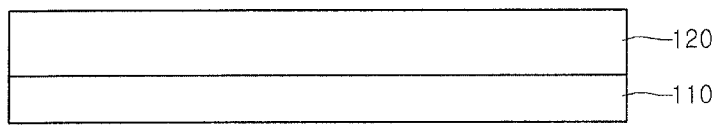
FIGS. 3 to 10 are views illustrating a process for fabricating the light emitting device according to the first embodiment.

Referring to FIG. 3, a base semiconductor layer 120 may be formed on a substrate 110.

The substrate 110 may be formed of at least one of sapphire ($Al_2O_3$), SiC, GaAs, GaN, ZnO, Si, GaP, InP, and Ge, but is not limited thereto.

The base semiconductor layer 120 may reduce a lattice constant difference between the substrate 110 and the first semiconductor layer 120. Also, the base semiconductor layer 120 may allow the first semiconductor layer 130 to be grown with good crystalline.

For example, the base semiconductor layer 120 may include at least one layer of a buffer layer, a non-conductive semiconductor, and a first conductive type semiconductor layer, but is not limited thereto.

The buffer layer may reduce the lattice constant difference between the substrate 110 and the first semiconductor layer 130. The buffer layer may be formed of a semiconductor material having a compositional formula of $In_xAl_yGa_{1-x-y}N$ ($0 \le x \le 1$, $0 \le y \le 1$, $0 \le x+y \le 1$), e.g., one of InAlGaN, GaN, AlGaN, InGaN, AlN, InN, and AlInN.

The non-conductive semiconductor layer may be a layer having significantly low conductivity than those of the first conductive type semiconductor layers and a second conductive type semiconductor layer 150 because it is not doped with a conductive type dopant. For example, the non-conductive semiconductor layer may be a non-conductive semiconductor layer, e.g., an undoped GaN layer, but is not limited thereto.

For example, the first conductive type semiconductor layer may include an N-type semiconductor layer. The N-type semiconductor layer may be formed of a semiconductor material having a compositional formula of $In_xAl_yGa_{1-x-y}N$ ($0 \le x \le 1$, $0 \le y \le 1$, $0 \le x+y \le 1$), e.g., one of InAlGaN, GaN, AlGaN, InGaN, AlN, InN, and AlInN. The N-type semiconductor layer may be doped with an N-type dopant such as Si, Ge, or Sn.

Figure 4:
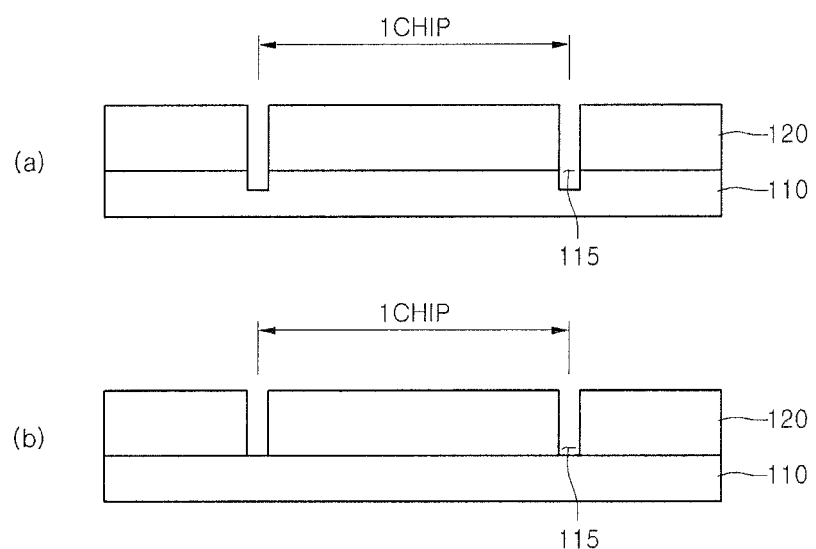

Referring to FIG. 4, an isolation process may be performed to form an etch concave portion 115 along a chip boundary region in the base semiconductor layer 120 and the substrate 110.

The etch concave portion 115 formed in the chip boundary region may separate a plurality of light emitting devices into individual chip units. The etch concave portion 115 may have a distance substantially corresponding to that of a second width (see reference symbol D2 of FIG. 1).

Here, as shown in FIG. 4A, the etch concave portion 115 may pass through the base semiconductor layer 120. Also, a portion of the substrate 110 may be exposed or removed through the etch concave portion 115. Alternatively, as shown in FIG. 4B, the etch concave portion 115 may pass through only the base semiconductor layer 120. That is, the etch concave portion is not limited to a depth thereof, and the depth of the etch concave portion 115 may be variously varied according to a design of the light emitting device 100.

The etch concave portion 115 may be formed using an etching process including a dry etching process and a wet etching process. For example, the dry etching process may include an inductive coupled plasma process or a reactive ion etching process. The wet etching process may include a process in which an etchant such as HF, KOH, $H_2SO_4$, $H_2O_2$, HCl, NaOH, $NH_4OH$, $HNO_3$, or BOE is used. However, the present disclosure is not limited thereto.

Alternatively, the etch concave portion 115 may be formed using a laser process. For example, the laser may use an Nd:YAG laser, but is not limited thereto.

The etch concave portion 115 may separate a plurality of light emitting devices into individual chip units to easily perform a successive process such as a breaking process.

For example, since the substrate 110 is exposed along a chip boundary region by the etch concave portion 115, the etch concave portion 115 may separate the plurality of light emitting devices into the individual chip units as well as reduce an area in which the LLO process for separating the substrate 110 from the base semiconductor layer 120 is performed to improve reliability of a fabricating process of the light emitting device 100.

Also, since the etch concave portion 115 is formed, a space in which $N_2$ gas generated in the LLO process for removing the substrate 110 from the light emitting structure 145 and the base semiconductor layer 120 of the light emitting device 100 is discharged may be secured to prevent the light emitting structure 145 from being damaged, e.g., cracked or cleaved by the $N_2$ gas. Thus, reliability of the LLO process and the fabricating process of the light emitting device 100 may be improved.

Figure 5:
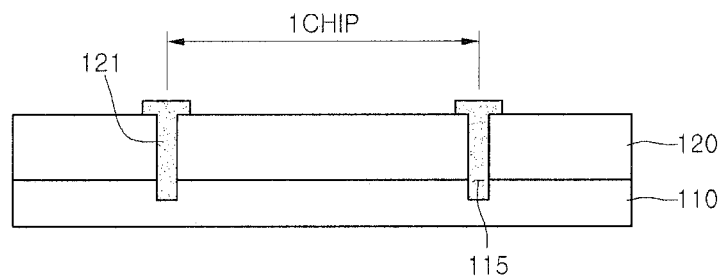

Referring to FIG. 5, a mask member 121 may be formed in the etch concave portion 115. For example, the mask member 121 may be formed of a material, which can be easily removed by a simple process such as a photoresist process.

As shown in FIG. 5, the mask member 121 may be formed in the etch concave portion 115 and a portion of a top surface of the base semiconductor layer 120. That is, a portion of the mask member 121 may protrude from the top surface of the base semiconductor layer 120, but is not limited thereto.

Figure 6:
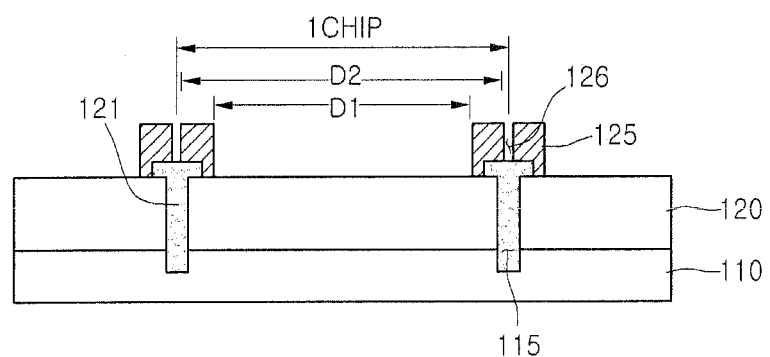

Referring to FIG. 6, a protection member 125 may be formed on the mask member 121. That is, the protection member 125 may be formed along the etch concave portion 115 on the base semiconductor layer 120. The protection member 125 may be spaced from an adjacent protection member 125 by a distance of a first width D1. The protection member 125 may have a width equal to that between a second width D2 and the first width D1. The second width D2 may be equal to a chip distance 1CHIP, but is not limited thereto.

The protection member 125 may be formed on only the mask member 121 or on the mask member 121 and the base semiconductor layer 120, but is not limited thereto.

For example, the protection member 125 may be formed to have a boundary groove 126 along the chip boundary region by a photolithography process. A portion of the mask member 121 may be exposed through the boundary groove 125.

Since the protection member 125 includes the boundary groove 126 to easily perform a breaking process for separating the plurality of light emitting devices into individual chip units, the reliability of the fabricating process of the light emitting device 100.

The protection member 125 may be formed of a light-transmitting material or insulator having a refractive index less than that of a semiconductor material, e.g., at least one of $SiO_2$, $Si_xO_y$, $Si_3N_4$, $Si_xN_y$, $SiO_xN_y$, $Al_2O_3$, but is not limited thereto. The protection member 125 may have a polygonal frame shape, a continuous loop shape or ring shape.

Figure 7:
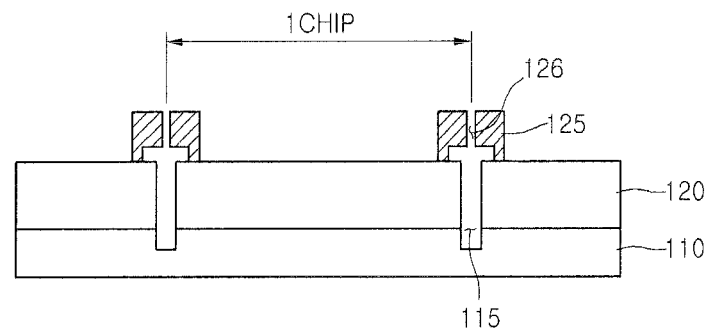

Referring to FIG. 7, an etching process may be performed through the boundary groove 126 to remove the mask member 121.

When the mask member 121 is formed of a photoresist, an etching solution or thinner for removing the photoresist may be injected through the boundary groove 126 or a tool such as an asher may be used to remove the mask member 121. Since this can be easily understood by skilled person, detailed description will be omitted.

After the mask member 121 is removed, the etch concave portion 115 may be an air gap filled with air.

Since the etch concave portion 115 is formed into the air gap, a space in which $N_2$ gas generated in the LLO process for removing the substrate 110 from the base semiconductor layer 120 is discharged may be secured to improve the reliability of the fabricating process of the light emitting device 100.

In detail, energy of a laser may be concentrated onto an interface between the base semiconductor layer 120 and the substrate 110 by the LLO process. Thus, GaN contained in the light emitting structure 145 and the base semiconductor layer 120 is separated into Ga and the N2 gas. As a result, the substrate 110 may be exfoliated from the base semiconductor layer 120 and the light emitting structure 145. If the space in which the $N_2$ gas is discharged is not secured, the $N_2$ gas may be permeated into the light emitting structure 145 to cause damages such as cracking and cleaving in the light emitting structure 145.

Thus, in the current embodiment, since the etch concave portion is formed to secure the space in which the $N_2$ gas is discharged, the substrate 110 may be stably removed from the base semiconductor layer 120 to improve the reliability of the fabricating process of the light emitting device 100.

Figure 8:
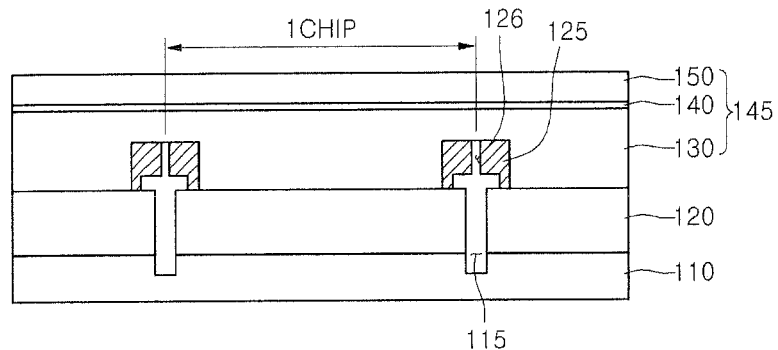

Referring to FIG. 8, the light emitting structure 145 may be formed on the base semiconductor layer 120 and the protection member 125.

The light emitting structure 145 may include the first semiconductor layer 130, an active layer 140, and a second conductive type semiconductor layer 150.

The base semiconductor layer 120 and the light emitting structure 145 may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto. A lower portion of the first semiconductor layer 130 may have the first width (see reference symbol D1 of FIG. 6), and an upper portion of the first semiconductor layer 130 may have a second width (see reference symbol D2 of FIG. 6).

Figure 9:
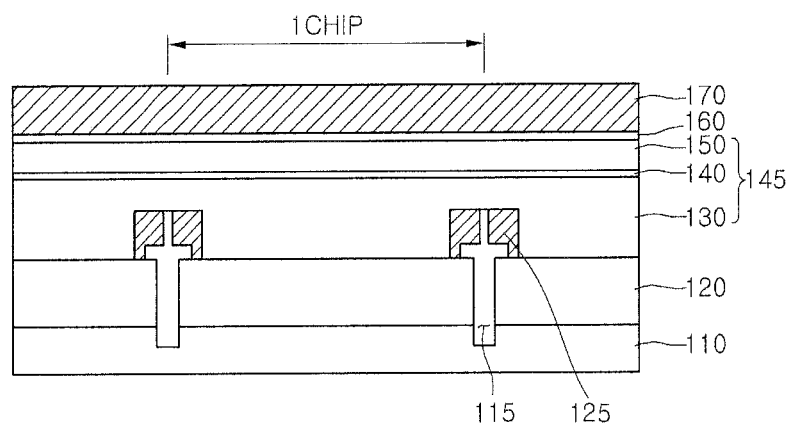

Referring to FIG. 9, at least one of a conductive support member 170 and a reflective layer 160 may be formed on the light emitting structure 145.

Figure 10:
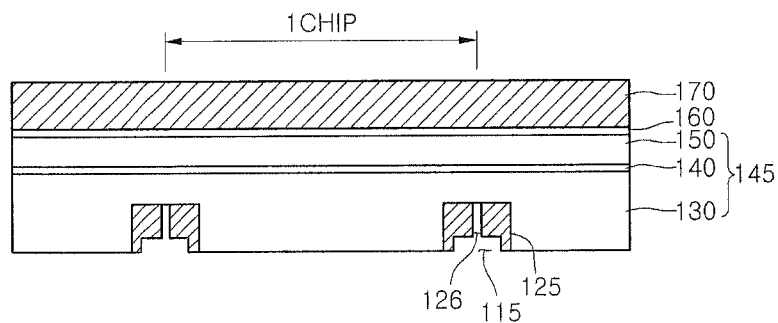

Referring to FIG. 10, the substrate 110 may be separated and removed from the base semiconductor layer 120.

The substrate 110 may be removed by the LLO process or/and the etching process, but is not limited thereto.

When the substrate 110 is removed by the LLO process, since the $N_2$ gas generated in the LLO process may be discharged into the etch concave portion 115, the reliability of the fabricating process of the light emitting device 100 may be improved.

Also, since the $N_2$ gas is filled into the etch concave portion 115 and the $N_2$ gas filled into the etch concave portion 115 is expanded by heat generated in the laser process, a pressure may be applied between the substrate 110 and the base semiconductor layer 120 to further easily separate the substrate 110 from the base semiconductor layer 120.

Also, since the substrate 110 is exposed along the chip boundary region by the etch concave portion 115, an area in which the LLO process is performed may be substantially reduced to improve the reliability of the fabricating process of the light emitting device 100.

After the substrate 110 is removed, portions of the base semiconductor layer 120 and the light emitting structure 145 may be removed by an etching process, e.g., an inductive coupled plasma/reactive ion etch (ICP/RIE) process. The etching process may be performed to polish a surface of the light emitting structure 145 and expose a region having the good crystalline and conductivity.

In the etching process, the protection member 125 may serve as an etch stop layer, but is not limited thereto.

The process of removing the substrate 110 may be performed after the light emitting structure 145 is formed, after the reflective layer 160 is formed, or after the conductive support member 170 is formed.

Referring to FIGS. 10 and 1, the breaking process for separating the plurality of light emitting devices into the individual chip units may be performed to prove the light emitting device 100 according to the current embodiment.

The breaking process may be performed using a cutter along the chip boundary region between the plurality of light emitting devices. Here, since the protection member 125 may be formed along the chip boundary region and the boundary groove 126 is formed in the protection member 125, the breaking process may be easily performed.

<Second Embodiment>

Hereinafter, a light emitting device 100B according to a second embodiment and a method for fabricating the same will be described in detail. In description of the second embodiment, the same part as those of the first embodiment will be described with reference to the first embodiment and their duplicated descriptions will be omitted.

Figure 11:
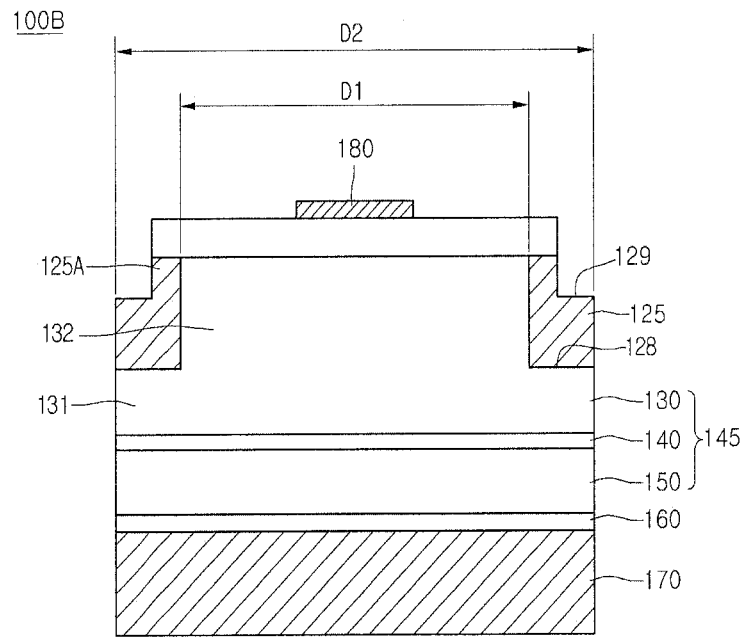
FIG. 11 is a sectional view of a light emitting device according to a second embodiment.

FIG. 11 is a sectional view of a light emitting device 100B according to a second embodiment. The light emitting device 100B according to the second embodiment is equal to the light emitting device 100 according to the first embodiment except the existence or inexistence of a base semiconductor layer.

Referring to FIG. 11, the light emitting device 100B includes a conductive support member 170, a reflective layer 160 on the conductive support member 170, a second conductive type semiconductor layer 150 on the reflective layer 160, an active layer 140 on the second conductive type semiconductor layer 150, a first semiconductor layer 130 on the active layer 140, a protection member 125 on at least one portion of a side surface of an upper region of the first semiconductor layer 120, a base semiconductor layer 120 on the first semiconductor layer 130 and the protection member 125, and a first electrode 180 on the base semiconductor layer 120.

Here, the second conductive type semiconductor layer 150, the active layer 140, and the first semiconductor layer 130 may constitute a light emitting structure.

The base semiconductor layer 120 may be disposed on the first semiconductor layer 130 and the protection member 125.

In detail, after a substrate (not shown) is removed from the first semiconductor layer 130, an etching process such as an ICP/RIE process may be performed on the base semiconductor layer 120. Here, the etching process may be performed to allow the base semiconductor layer 120 to remain on a top surface of the first semiconductor layer 130 and the protection member 125, thereby providing the light emitting device 100B.

The base semiconductor layer 120 may include at least one of a buffer layer, a non-conductive semiconductor layer, and a first conductive type semiconductor layer. However, since the first electrode 180 should be disposed on the base semiconductor layer 120, only the first conductive type semiconductor layer may remain.

<Third Embodiment>

Hereinafter, a light emitting device 100C according to a third embodiment and a method for fabricating the same will be described in detail. In description of the third embodiment, the same part as those of the first embodiment will be described with reference to the first embodiment and their duplicated descriptions will be omitted.

Figure 12:
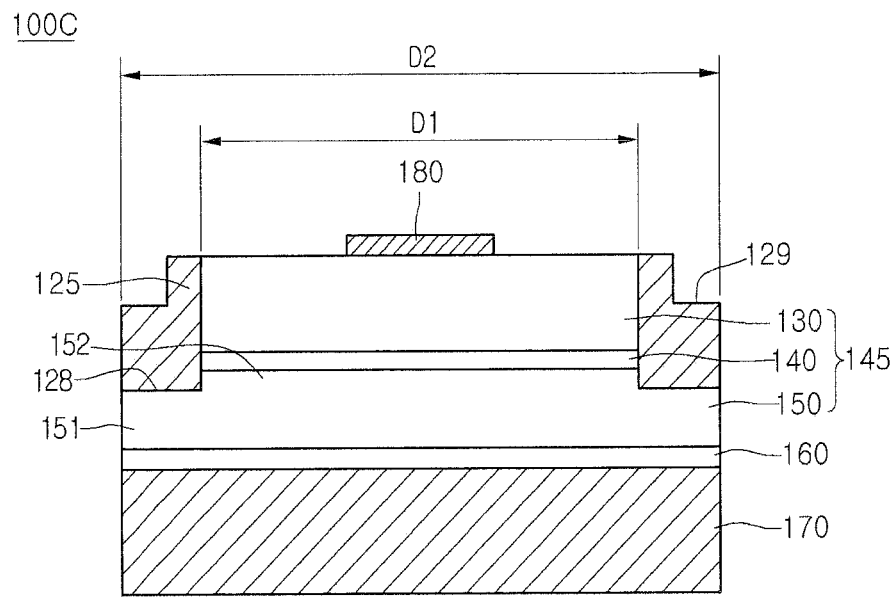
FIG. 12 is a sectional view of a light emitting device according to a third embodiment.

FIG. 12 is a sectional view of a light emitting device 100C according to a third embodiment. The light emitting device 100C according to the third embodiment is equal to the light emitting device 100 according to the first embodiment except disposition of a protection member.

Referring to FIG. 12, the light emitting device 100C includes a conductive support member 170, a reflective layer 160 on the conductive support member 170, a light emitting structure 145 on the reflective layer 160, a protection member 125 on at least one portion of a side surface of an upper end of the light emitting structure 145, and a first electrode 180 on a first semiconductor layer 130.

The light emitting structure 145 includes a second conductive type semiconductor layer 150, an active layer 140, and a first semiconductor layer 130. Each of the active layer 140, and the second conductive type semiconductor layer 150, and an upper portion 152 of the first semiconductor layer 130 may have a first width D1, and a lower portion 151 of the second conductive type semiconductor layer 150 may have a second width D2. Thus, a stepped structure 128 may be disposed around the light emitting structure 145.

A side surface of the protection member 125 may contact at least one of the first semiconductor layer 130, the active layer 140, and the second conductive type semiconductor layer 150.

That is, a top surface of the protection member 125 may flush with that of the first semiconductor layer 130. Also, a bottom surface of the protection member 125 may disposed on the second conductive type semiconductor layer 150. Also, a stepped structure 129 may be disposed around the protection member 125.

To form the above-described shape of the protection member 125, the protection member 125 may be adjusted in thickness in a fabricating process of the light emitting device 100C, or the first semiconductor layer 130 and the second conductive type semiconductor layer 150 may be adjusted in thickness, but is not limited thereto.

<Fourth Embodiment>

Hereinafter, a light emitting device 100D according to a fourth embodiment and a method for fabricating the same will be described in detail. In description of the fourth embodiment, the same part as those of the first embodiment will be described with reference to the first embodiment and their duplicated descriptions will be omitted.

Figure 13:
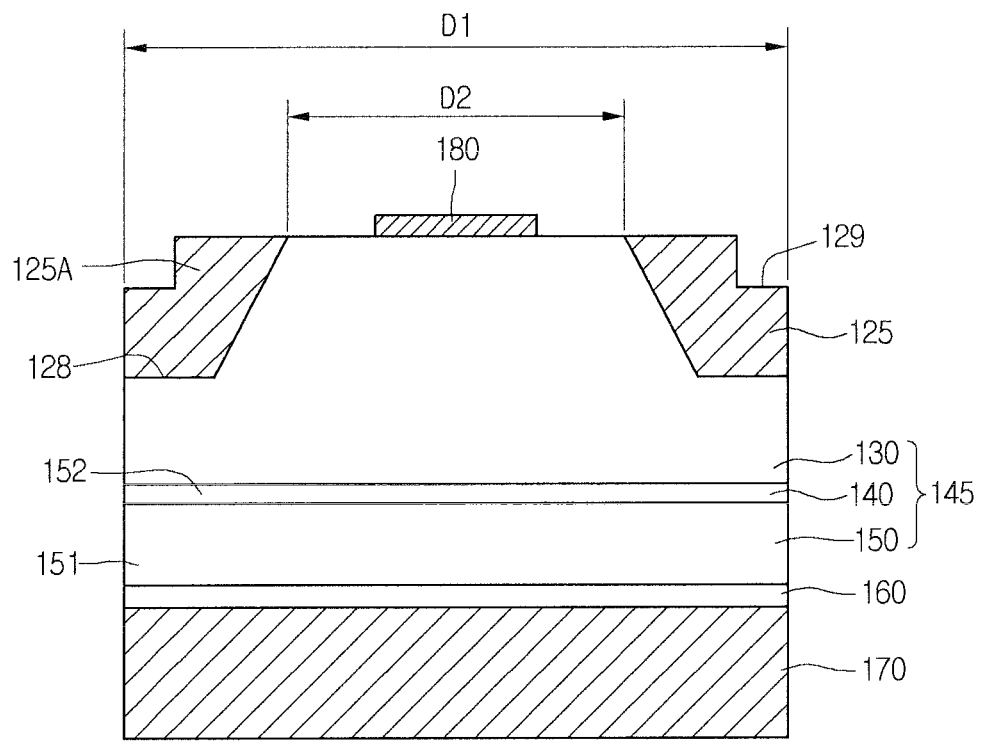
FIG. 13 is a sectional view of a light emitting device according to a fourth embodiment.

FIG. 13 is a sectional view of a light emitting device 100D according to a fourth embodiment.

The light emitting device 100D according to the fourth embodiment is equal to the light emitting device 100 according to the first embodiment except structures of a protection member and a stepped portion.

Referring to FIG. 13, the light emitting device 100D includes a conductive support member 170, a reflective layer 160 on the conductive support member 170, a light emitting structure 145 on the reflective layer 160, a protection member 125 on at least one portion of a side surface of an upper end of the light emitting structure 145, and a first electrode 180 on a first semiconductor layer 130.

The light emitting structure 145 includes a second conductive type semiconductor layer 150, an active layer 140, and a first semiconductor layer 130. An upper portion 132 of the first semiconductor layer 130 has a first width D1, and a lower portion of the first semiconductor layer 130 has a second width D2. Thus, a stepped structure 128 may be disposed around the light emitting structure 145.

Here, the stepped structure 128 may have an inclined side surface.

That is, a side surface of the upper portion 132 having the first width D1 is inclined and extends to the lower portion 131 having the second width D2.

The protection member 125 is disposed on the stepped structure 128.

That is, a top surface of the protection member 125 may be flush with that of the first semiconductor layer 130, and a bottom surface of the protection member 125 may contact a top surface of the lower portion 131 of the first semiconductor layer 130. Also, a stepped structure 129 may be disposed on a circumference 125A of the protection member 125.

To form the above-described shape of the protection member 125, when the protection member 125 is formed in the process of FIG. 6 of the fabricating processes of FIGS. 3 to 10, the side surface of the protection member 125 may be inclined to have a trapezoid shape.

<Fifth Embodiment>

Hereinafter, a light emitting device 100E according to a fifth embodiment and a method for fabricating the same will be described in detail. In description of the fifth embodiment, the same part as those of the first embodiment will be described with reference to the first embodiment and their duplicated descriptions will be omitted.

Figure 14:
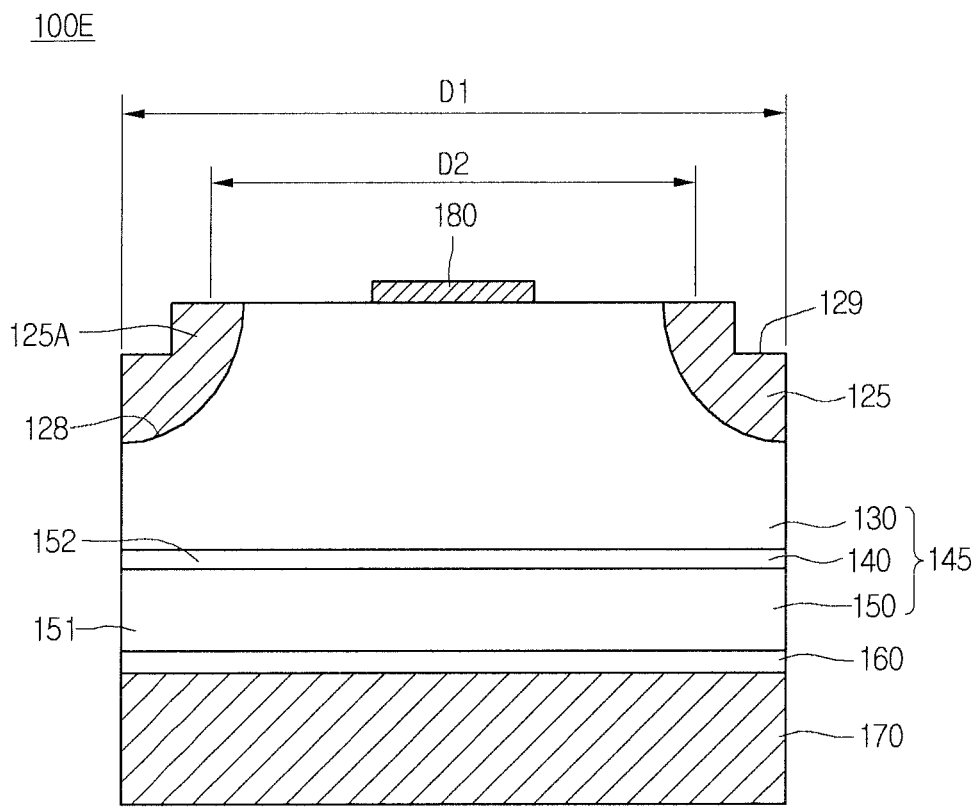
FIG. 14 is a sectional view of a light emitting device according to a fifth embodiment.

FIG. 14 is a sectional view of a light emitting device 100E according to a fifth embodiment.

The light emitting device 100E according to the fifth embodiment is equal to the light emitting device 100 according to the first embodiment except a protection member 125 and a stepped structure 129.

Referring to FIG. 14, the light emitting device 100E includes a conductive support member 170, a reflective layer 160 on the conductive support member 170, a light emitting structure 145 on the reflective layer 160, a protection member 125 on at least one portion of a side surface of an upper end of the light emitting structure 145, and a first electrode 180 on a first semiconductor layer 130.

The light emitting structure 145 includes a second conductive type semiconductor layer 150, an active layer 140, and a first semiconductor layer 130. An upper portion of the first semiconductor layer 130 has a first width D1, and a lower portion of the first semiconductor layer 130 has a second width D2. Also, a concave groove connecting the upper portion to the lower portion is formed in the first semiconductor layer 130.

That is, the concave groove may be formed around the light emitting structure 145 to realize the stepped structure 12R.

The protection member 125 fills the concave groove and is disposed on the stepped structure 128.

That is, a top surface of the protection member 125 may flush with that of the first semiconductor layer 130. The protection member 125 fills the groove along a side surface of the stepped structure 128. To form the above-described shape of the protection member 125, when the protection member 125 is formed on a mask member 121 in the process of FIG. 6 of the fabricating processes of FIGS. 3 to 10, the side surface of the protection member 125 may have a convex curved surface to have a bell shape. Also, a stepped structure 129 may be disposed on a circumference 125A of the protection member 125.

Although the modified examples of the first embodiment are described in the fourth and fifth embodiments, the modified examples of the second and third embodiments may be applied to the fourth and fifth embodiments, but is not limited thereto.

<Light Emitting Device Package>

Figure 15:
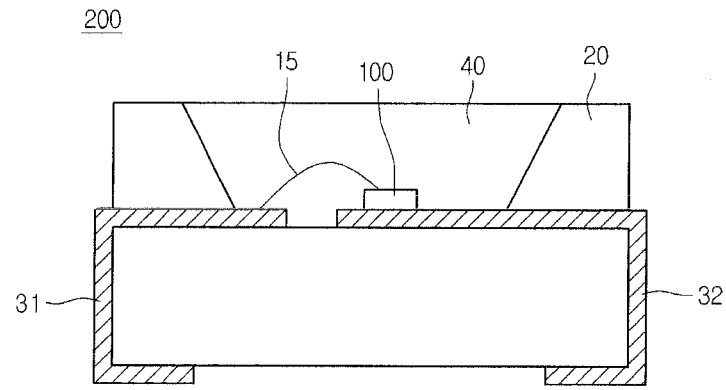
FIG. 15 is a sectional view of a light emitting device package including the light emitting device according to the embodiments.

FIG. 15 is a sectional view of a light emitting device package including a light emitting device according to an embodiment.

Referring to FIG. 15, a light emitting device package 200 according to an embodiment include a body part 20, first and second lead electrodes 31 and 32 disposed on the body part 20, a light emitting device 100 disposed on the body part 20 and electrically connected to the first and second lead electrodes 31 and 32, and a molding member 40 surrounding the light emitting device 100.

The body part 20 may be formed of a silicon material, a synthetic resin material, or a metal material. An inclined surface may be disposed around the light emitting device 100.

The first lead electrode 31 and the second lead electrode 32 may be electrically separated from each other and provide a power to the light emitting device 100. Also, the first and second lead electrodes 31 and 32 may reflect light generated in the light emitting device 100 to improve light efficiency. In addition, the first and second lead electrodes 31 and 32 may discharge heat generated in the light emitting device 100 to the outside.

The light emitting device 100 may be disposed on the body part 20 or the first or second lead electrode 31 or 32.

Although a wire method in which the light emitting device 100 is electrically connected to the first and second lead electrodes 31 and 32 through a wire is illustrated, the present disclosure is not limited thereto. For example, the light emitting device 100 may be electrically connected to the first and second lead electrodes 31 and 32 through a flip-chip method or a die bonding method.

The molding member 40 may surround the light emitting device 100 to protect the light emitting device 100. Also, a phosphor may be contained in the molding member 40 to change a wavelength of light emitted from the light emitting device 100. The molding member 40 may contact a stepped structure of the light emitting device 100.

Although a top view type package is illustrated in the current embodiment, the present disclosure is not limited thereto. For example, a side view type package may be used to improve a heat dissipation characteristic, conductivity, and a reflection characteristic. When the top view or side view type light emitting device package is applied to indicating devices, lighting devices, and display devices, reliability with respect to heat dissipation efficiency may be improved.

The light emitting device package according to an embodiment may be applicable to a lighting unit. The lighting unit has a structure in which a plurality of light emitting device packages is arrayed. Thus, the lighting unit may include the display device illustrated in FIGS. 16 and 17, the lighting device illustrated in FIG. 18. In addition, the lighting unit may include illumination lamps, traffic lights, vehicle headlights, and signs.

Figure 16:
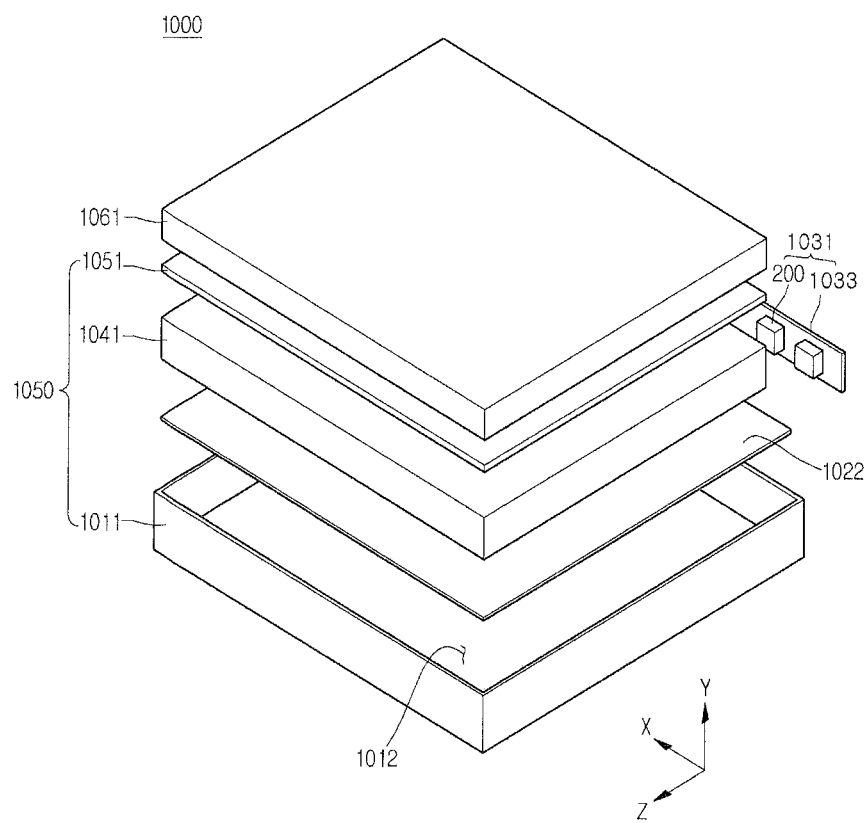
FIG. 16 is a view of a display device according to an embodiment.

FIG. 16 is a view of a display device according to an embodiment.

Referring to FIG. 16, a display device according to an embodiment may include a light guide plate 1041, a light emitting module 1031 providing light to the light guide plate 1041, a reflective member 1022 under the light guide plate 1041, an optical sheet 1051 above the light guide plate 1041, a display panel 1061 above the optical sheet 1051, and a bottom cover 1011 receiving the light guide plate 1041, the light emitting module 1031, and the reflective member 1022, but is not limited thereto.

The bottom cover 1011, the reflective member 1022, the light guide plate 1041, and the optical sheet 1051 may be defined as the light unit 1050.

The light guide plate 1041 diffuses light to produce planar light. The light guide plate 1041 may be formed of a transparent material, e.g., one of an acrylic resin-based material such as polymethyl metaacrylate (PMMA), a polyethylene terephthalate (PET) resin, a poly carbonate (PC) resin, a cycloolefin copolymer (COC) resin, and a polyethylene naphthalate (PEN) resin.

The light emitting module 1031 is disposed on at least one lateral surface of the light guide plate 1041 to provide light. Thus, the light emitting module 1031 may be used as a light source of the display device.

At least one light emitting module 1031 may be disposed on one side surface of the light guide plate 1041 to directly or indirectly provide light. The light emitting module 1031 may include a board 1033 and the light emitting device packages 200 according to the above-described embodiments. The light emitting device packages 200 may be arrayed on the board 1033 by a predetermined distance. The light emitting device packages 200 may be arrayed on the board 1033, or light emitting devices may be arrayed on the board 1033 in a chip shape.

The board 1033 may be a printed circuit board (PCB) having a circuit pattern (not shown). Also, the board 1033 may include a general PCB, a metal core PCB (MCPCB), or a flexible PCB (FPCB), but is not limited thereto. When the light emitting device packages 200 are mounted on a side surface of the bottom cover 1011 or on a heatsink plate, the board 1033 may be removed. Here, a portion of the heatsink plate may contact a top surface of the bottom cover 1011.

The plurality of light emitting device packages 200 may be mounted on the board 1033 to allow a light emitting surface through which light is emitted to be spaced a predetermined distance from the light guide plate 1041, but is not limited thereto. The light emitting device packages 200 may directly or indirectly provide light to a light incident surface that is a side surface of the light guide plate 1041, but is not limited thereto.

The reflective member 1022 may be disposed below the light guide plate 1041. The reflective member 1022 reflects light incident through an under surface of the light guide plate 1041 upwardly to improve brightness of the lighting unit 1051. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with a top surface opened, but is not limited thereto. The bottom cover 1011 may be coupled to a top cover, but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel and include first and second boards formed of a transparent material and a liquid crystal layer between the first and second boards. A polarizing plate may be attached to at least one surface of the display panel 1061. The present disclosure is not limited to the attached structure of the polarizing plate. The display panel 1061 displays information using light transmitting the optical sheet 1051. The display unit 1000 may be applied to various portable terminals, monitors for notebook computers, monitors for laptop computers, televisions, etc.

The optical sheet 1051 is disposed between the display panel 1061 and the light guide plate 1041 and includes at least one light-transmitting sheet. For example, the optical sheet 1051 may include at least one of sheets such as a diffusion sheet, a horizontal or vertical prism sheet, and a brightness enhanced sheet. The diffusion sheet diffuses incident light, and the horizontal or/and vertical prism sheet(s) collect(s) the incident light into a display region. Also, the brightness enhanced sheet reuses lost light to improve the brightness. Also, a protection sheet may be disposed on the display panel 1061, but is not limited thereto.

Here, optical members such as the light guide plate 1041 and the optical sheet 1051 may be disposed on an optical path of the light emitting module 1031, but is not limited thereto.

Figure 17:
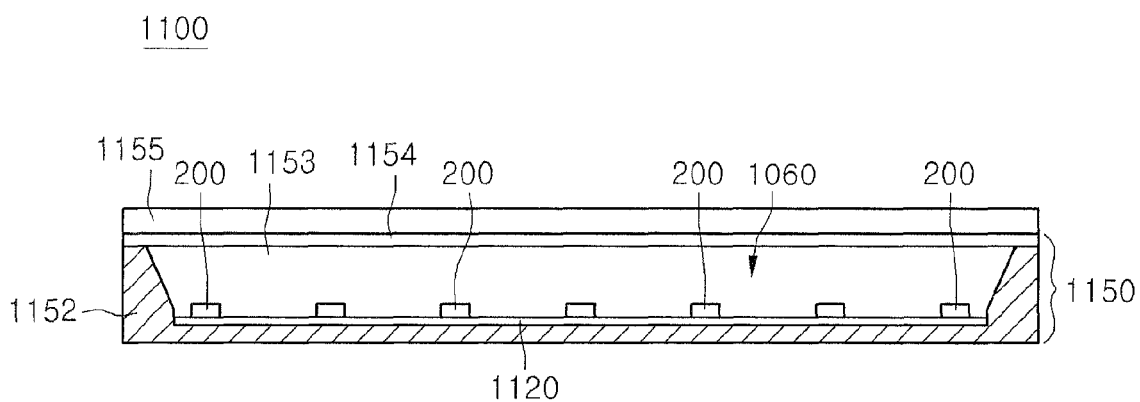
FIG. 17 is a view illustrating another example of the display device according to an embodiment.

FIG. 17 is a view illustrating another example of the display device according to an embodiment.

Referring to FIG. 17, a display unit 1100 includes a bottom cover 1152, a light emitting module 1060 including the foregoing light emitting device package 200 and a board 1120, an optical member 1154, and a display panel 1155.

The board 1120 and the light emitting device package 200 may be defined as the light emitting module 1060. The bottom cover 1152, at least one light emitting module 1060, and the optical member 1154 may be defined as a lighting unit. The packages or individual chips may be arrayed on the board, but is not limited thereto.

The bottom cover 1152 may include a receiving part 1153, but is not limited thereto.

Here, the optical member 1154 may include at least one of a lens, a light guide plate, a diffusion sheet, horizontal and vertical prism sheets, and a bright enhanced sheet. The light guide plate may be formed of a PC material or poly methy methacrylate (PMMA) material. In this case, the light guide plate may be removed. The diffusion sheet diffuses incident light, and the horizontal and vertical prism sheets collect the incident light into a display region. The brightness enhanced sheet reuses lost light to improve brightness.

Figure 18:
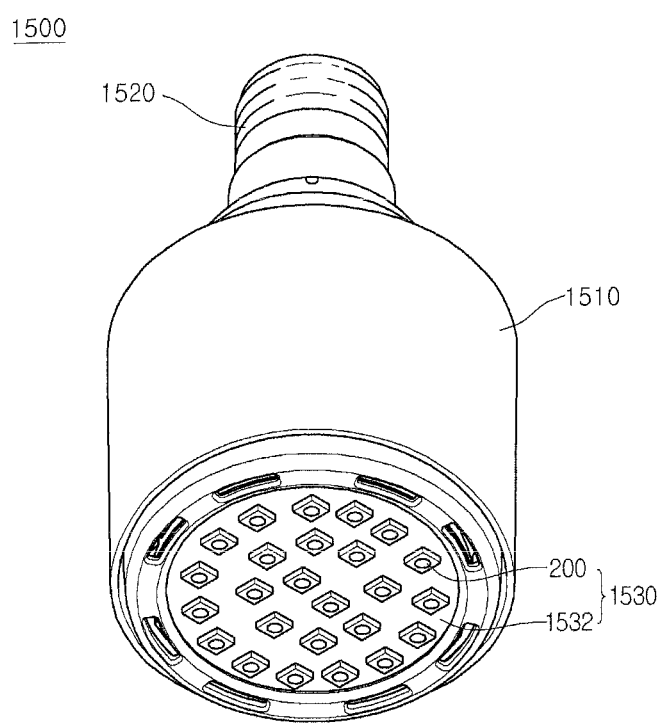
FIG. 18 is a view of a lighting device according to an embodiment.

FIG. 18 is a view of a lighting device according to an embodiment.

Referring to FIG. 18, the lighting unit 1500 may include a case 1510, a light emitting module 1530 in the case 1510, and a connection terminal 1520 disposed in the case 1510 to receive a power from an external power source.

The case 1510 may be preferably formed of a material having good heat dissipation characteristics, for example, a metal material or a resin material.

The light emitting module 1530 may include a board 1532 and a light emitting device package 200 mounted on the board 1532. The light emitting device package 200 may be provided in plurality, and the plurality of light emitting device packages 200 may be arrayed in a matrix shape or spaced a predetermined distance from each other. Alternatively, the plurality of light emitting device packages 200 may be arrayed on the board 1532 into a chip unit.

The board 1532 may be an insulator on which a circuit pattern is printed. For example, the board may include a general printed circuit board (PCB), a metal core PCB, a flexible PCB, a ceramic PCB, FR-4, etc.

Also, the board 1532 may be formed of a material to efficiently reflect light, and a surface thereof may be formed in a color capable of efficiently reflecting light. For example, the board 1532 may be a coated layer having a white color or a silver color.

The at least one light emitting device packages 200 may be mounted on the board 1532. Each of the light emitting device packages 200 may include at least one light emitting diode (LED) chip. The LED chip may include a color LED emitting red, green, blue or white light, and a UV LED emitting ultraviolet (UV) rays.

The light emitting module 1530 may have a combination of several light emitting device packages 200 to obtain desired color and brightness. For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be screwed and coupled to an external power source in a socket type, but is not limited thereto. For example, the connection terminal 1520 may be made in a pin type and inserted into an external power source, or may be connected to the external power source through a wire.

The chips arrayed on the substrate according to the embodiment may be packaged suing a resin material such as the molding member. The molding member may serve as a lens.

The embodiments may provide the light emitting device having the improved reliability, the method for fabricating the light emitting device, and the light emitting device package.

The embodiments may also provide the light emitting device having the high fabrication process yield, the method for fabricating the light emitting device, and the light emitting device package.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
a light emitting device;
a body on which the light emitting device is mounted;
first and second electrodes disposed on the body, the first and second electrodes being electrically connected to the light emitting device; and
a molding member surrounding the light emitting device, wherein the light emitting device comprises:
a conductive support member electrically connected to the first electrode;
a light emitting structure on the conductive support member, the light emitting structure comprising a first conductive type semiconductor layer, an active layer under the first conductive type semiconductor layer, and a second conductive type semiconductor layer under the active layer;
an electrode member on the first conductive type semiconductor layer of the light emitting structure; and
a protection member covering a portion of the light emitting structure,
wherein the light emitting structure has a first top surface and a second top surface under the first top surface, the first and second top surfaces of the light emitting structure have a stepped structure, and the protection member having a top surface is disposed on the second top surface of the light emitting structure, and
wherein a bottom surface of the protection member is spaced apart from both a side surface and a top surface of the active layer, and
wherein a top surface of the first conductive type semiconductor layer is exposed through the protection member, and wherein a top-most surface of the first conductive semiconductor layer is substantially flush with a top-most surface of the protection member.

2. The light emitting device package of claim 1, wherein the stepped structure of the light emitting structure is disposed around the first conductive type semiconductor layer.

3. The light emitting device package of claim 1, wherein a top surface of the first conductive type semiconductor layer has the same width as that of the first top surface, and the top surface of the first conductive type semiconductor layer is flush with that of the protection member.

4. The light emitting device package of claim 1, wherein the protection member is formed of at least one light-transmitting material selected from the group consisting of $SiO_2$, $Si_xO_y$, $Si_3N_4$, $Si_xN_y$, $SiO_xN_y$, and $Al_2O_3$, wherein the light-transmitting material has a refractive index less than that of a semiconductor material of the light emitting structure.

5. The light emitting device package of claim 1, wherein a circumference of the protection member comprises a second stepped structure.

6. The light emitting device package of claim 5, wherein the protection member has a continuous loop shape or a ring shape around the light emitting structure.

7. The light emitting device package of claim 1, wherein the electrode member is electrically connected to the second electrode through a wire.

8. The light emitting device package of claim 1, wherein the first conductive type semiconductor layer comprises the stepped structure of the light emitting structure.

9. The light emitting device package of claim 1, wherein the protection member comprises an inclined structure.

10. The light emitting device package of claim 1, wherein the protection member has a polygonal frame shape.

11. The light emitting device of claim 1, further comprising a reflective layer, and an ohmic layer or an adhesive layer between the second conductive type semiconductor layer and the conductive support member.

12. The light emitting device package of claim 1, wherein a contour of the protection member comprises a second stepped structure defining a lower portion of the protection member and an upper portion of the protection member extending from an upper surface of the lower portion.

13. The light emitting device of claim 1, wherein the molding member has a substantially flat top surface.

* * * * *